(12) United States Patent
Gower et al.

(10) Patent No.: US 7,899,983 B2
(45) Date of Patent: *Mar. 1, 2011

(54) BUFFERED MEMORY MODULE SUPPORTING DOUBLE THE MEMORY DEVICE DATA WIDTH IN THE SAME PHYSICAL SPACE AS A CONVENTIONAL MEMORY MODULE

(75) Inventors: Kevin C. Gower, LaGrangeville, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 593 days.

This patent is subject to a terminal disclaimer.

(21) Appl. No.: 11/848,335

(22) Filed: Aug. 31, 2007

(65) Prior Publication Data

US 2009/0063785 A1 Mar. 5, 2009

(51) Int. Cl.
*G06F 13/00* (2006.01)
(52) U.S. Cl. ............... 711/105; 711/154; 711/E12.001; 365/189.05
(58) Field of Classification Search ........................ None
See application file for complete search history.

(56) References Cited

U.S. PATENT DOCUMENTS

| | | | |
|---|---|---|---|
| 5,367,643 A | 11/1994 | Chang et al. |
| 5,386,540 A | 1/1995 | Young et al. |
| 5,513,135 A | 4/1996 | Dell et al. |
| 5,598,113 A | 1/1997 | Jex et al. |
| 5,640,349 A | 6/1997 | Kakinuma et al. |
| 5,867,731 A | 2/1999 | Williams et al. |
| 5,887,272 A | 3/1999 | Sartore et al. |
| 5,896,404 A | 4/1999 | Kellogg et al. |
| 6,049,476 A | 4/2000 | Laudon et al. |

(Continued)

FOREIGN PATENT DOCUMENTS

WO   WO 99/49468   9/1999

(Continued)

OTHER PUBLICATIONS

Alghazo, Jaafar et al., "SF-LRU Cache Replacement Algorithm", Records of the 2004 International Workshop on Memory Technology, Design and Testing (MTDT), Aug. 2004, 6 pages.

(Continued)

*Primary Examiner*—Kaushikkumar Patel
(74) *Attorney, Agent, or Firm*—Francis Lammes; Stephen J. Walder, Jr.; Diana R. Gerhardi

(57) ABSTRACT

A memory system is provided that enhances the memory bandwidth available through a memory module. The memory system includes a memory hub device integrated into a memory module, a first memory device data interface integrated that communicates with a first set of memory devices and a second memory device data interface integrated that communicates with a second set of memory devices. In the memory system, the first set of memory devices are spaced in a first plane and coupled to a substrate of the memory module and the second set of memory devices are spaced in a second plane above the first plane and coupled to the substrate. In the memory system, data buses of the first set of memory devices are coupled to the substrate separately from data buses of the second set of memory devices.

15 Claims, 8 Drawing Sheets

U.S. PATENT DOCUMENTS

| | | | |
|---|---|---|---|
| 6,095,827 | A | 8/2000 | Dutkowsky et al. |
| 6,109,929 | A | 8/2000 | Jasper |
| 6,141,728 | A | 10/2000 | Simionescu et al. |
| 6,263,448 | B1 | 7/2001 | Tsern et al. |
| 6,279,072 | B1 | 8/2001 | Williams et al. |
| 6,285,622 | B1 | 9/2001 | Haraguchi et al. |
| 6,356,500 | B1 | 3/2002 | Cloud et al. |
| 6,397,287 | B1 | 5/2002 | Brown et al. |
| 6,397,290 | B1 | 5/2002 | Williams et al. |
| 6,401,149 | B1 | 6/2002 | Dennin et al. |
| 6,415,349 | B1 | 7/2002 | Hull et al. |
| 6,418,068 | B1 | 7/2002 | Raynham |
| 6,477,614 | B1 | 11/2002 | Leddige et al. |
| 6,507,887 | B1 | 1/2003 | Pontius et al. |
| 6,512,644 | B1 | 1/2003 | Hall et al. |
| 6,584,543 | B2 | 6/2003 | Williams et al. |
| 6,683,372 | B1 | 1/2004 | Wong et al. |
| 6,721,864 | B2 | 4/2004 | Keskar et al. |
| 6,785,837 | B1 | 8/2004 | Kilmer et al. |
| 6,789,169 | B2 | 9/2004 | Jeddeloh |
| 6,821,144 | B2 | 11/2004 | Choy |
| 6,822,960 | B1 | 11/2004 | Manchester et al. |
| 6,848,060 | B2 | 1/2005 | Cook et al. |
| 6,889,284 | B1 | 5/2005 | Nizar et al. |
| 6,910,145 | B2 | 6/2005 | MacLellan et al. |
| 6,938,119 | B2 | 8/2005 | Kohn et al. |
| 6,952,745 | B1 | 10/2005 | Dodd et al. |
| 6,961,281 | B2 | 11/2005 | Wong et al. |
| 6,982,892 | B2 | 1/2006 | Lee et al. |
| 7,043,611 | B2 | 5/2006 | McClannahan et al. |
| 7,054,179 | B2 | 5/2006 | Cogdill et al. |
| 7,103,730 | B2 | 9/2006 | Saxena et al. |
| 7,111,143 | B2 | 9/2006 | Walker |
| 7,114,117 | B2 | 9/2006 | Tamura et al. |
| 7,117,328 | B2 | 10/2006 | Shibuya et al. |
| 7,120,727 | B2 | 10/2006 | Lee et al. |
| 7,124,332 | B2 | 10/2006 | Constantinescu |
| 7,133,972 | B2 | 11/2006 | Jeddeloh |
| 7,143,246 | B2 | 11/2006 | Johns |
| 7,162,669 | B2 | 1/2007 | Gross |
| 7,200,021 | B2 | 4/2007 | Raghuram |
| 7,200,023 | B2 | 4/2007 | Foster, Sr. |
| 7,203,874 | B2 | 4/2007 | Roohparvar |
| 7,210,015 | B2 | 4/2007 | Barth et al. |
| 7,216,196 | B2 | 5/2007 | Jeddeloh |
| 7,225,303 | B2 | 5/2007 | Choi |
| 7,234,099 | B2 | 6/2007 | Gower et al. |
| 7,269,042 | B2 | 9/2007 | Kinsley et al. |
| 7,272,070 | B2 | 9/2007 | Hummler |
| 7,490,209 | B1 | 2/2009 | Charagulla |
| 7,558,124 | B2 | 7/2009 | Wu et al. |
| 7,558,887 | B2 | 7/2009 | Gower et al. |
| 7,577,039 | B2 | 8/2009 | Yang et al. |
| 7,584,308 | B2 | 9/2009 | Gower et al. |
| 7,770,077 | B2 | 8/2010 | Arimilli et al. |
| 2002/0112119 | A1 | 8/2002 | Halbert et al. |
| 2003/0037280 | A1 | 2/2003 | Berg et al. |
| 2003/0061447 | A1* | 3/2003 | Perego et al. ............... 711/131 |
| 2003/0097526 | A1 | 5/2003 | Chiu et al. |
| 2003/0137862 | A1 | 7/2003 | Brunelle et al. |
| 2004/0006674 | A1 | 1/2004 | Hargis et al. |
| 2004/0024971 | A1 | 2/2004 | Bogin et al. |
| 2004/0109468 | A1 | 6/2004 | Anjanaiah |
| 2004/0117566 | A1 | 6/2004 | McClannahan et al. |
| 2004/0128464 | A1 | 7/2004 | Lee et al. |
| 2004/0213074 | A1 | 10/2004 | Johnson et al. |
| 2004/0236877 | A1 | 11/2004 | Burton |
| 2005/0033921 | A1 | 2/2005 | Jeddeloh |
| 2005/0050255 | A1 | 3/2005 | Jeddeloh et al. |
| 2005/0125702 | A1 | 6/2005 | Huang et al. |
| 2005/0138267 | A1 | 6/2005 | Bains et al. |
| 2005/0138302 | A1 | 6/2005 | Lusk et al. |
| 2005/0160250 | A1 | 7/2005 | Yoshimi |
| 2005/0216677 | A1 | 9/2005 | Jeddeloh et al. |
| 2005/0223161 | A1 | 10/2005 | Jeddeloh et al. |
| 2006/0095592 | A1 | 5/2006 | Borkenhagen |
| 2006/0117322 | A1 | 6/2006 | Gimness et al. |
| 2006/0123261 | A1 | 6/2006 | Riley et al. |
| 2006/0158917 | A1 | 7/2006 | Bartley et al. |
| 2006/0168407 | A1 | 7/2006 | Stern |
| 2006/0179262 | A1 | 8/2006 | Brittain et al. |
| 2006/0212775 | A1 | 9/2006 | Cypher |
| 2006/0235901 | A1 | 10/2006 | Chan |
| 2006/0245226 | A1 | 11/2006 | Stewart |
| 2006/0271755 | A1 | 11/2006 | Miura |
| 2006/0288132 | A1 | 12/2006 | McCall et al. |
| 2007/0005922 | A1 | 1/2007 | Swaminathan et al. |
| 2007/0011392 | A1 | 1/2007 | Lee et al. |
| 2007/0011562 | A1 | 1/2007 | Alexander et al. |
| 2007/0016718 | A1 | 1/2007 | Radhakrishnan et al. |
| 2007/0033317 | A1 | 2/2007 | Jeddeloh et al. |
| 2007/0050530 | A1 | 3/2007 | Rajan |
| 2007/0098020 | A1 | 5/2007 | Ja et al. |
| 2007/0106860 | A1 | 5/2007 | Foster et al. |
| 2007/0111606 | A1 | 5/2007 | Goodwin |
| 2007/0150672 | A1 | 6/2007 | Alexander et al. |
| 2007/0162648 | A1 | 7/2007 | Tousek |
| 2007/0162654 | A1 | 7/2007 | Miwa |
| 2007/0230230 | A1 | 10/2007 | Hofstra |
| 2007/0260841 | A1* | 11/2007 | Hampel et al. ............... 711/167 |
| 2008/0031030 | A1* | 2/2008 | Rajan et al. ................... 365/63 |
| 2008/0046666 | A1 | 2/2008 | Termaine |
| 2008/0170425 | A1 | 7/2008 | Rajan |
| 2008/0215792 | A1 | 9/2008 | Jeddeloh |
| 2008/0270741 | A1 | 10/2008 | Tremaine |
| 2009/0019195 | A1 | 1/2009 | Djordjevic |
| 2009/0063729 | A1 | 3/2009 | Gower et al. |
| 2009/0063730 | A1 | 3/2009 | Gower et al. |
| 2009/0063731 | A1 | 3/2009 | Gower et al. |
| 2009/0063761 | A1 | 3/2009 | Gower et al. |
| 2009/0063784 | A1 | 3/2009 | Gower et al. |
| 2009/0063787 | A1 | 3/2009 | Gower et al. |
| 2009/0063922 | A1 | 3/2009 | Gower et al. |
| 2009/0063923 | A1 | 3/2009 | Gower et al. |
| 2009/0125788 | A1 | 5/2009 | Wheeler et al. |
| 2009/0190427 | A1 | 7/2009 | Brittain et al. |
| 2009/0190429 | A1 | 7/2009 | Brittain et al. |
| 2009/0193200 | A1 | 7/2009 | Brittain et al. |
| 2009/0193201 | A1 | 7/2009 | Brittain et al. |
| 2009/0193203 | A1 | 7/2009 | Brittain et al. |
| 2009/0193290 | A1 | 7/2009 | Arimilli et al. |
| 2009/0193315 | A1 | 7/2009 | Gower et al. |

OTHER PUBLICATIONS

Delaluz, V. et al., "Scheduler-Based DRAM Energy Management", Proceedings of the 2002 Design Automation Conference (IEEE Cat. No. 02CH37324), Jun. 2002, pp. 697-702.

Huang, Hai et al., "Improving Energy Efficiency by Making DRAM Less Randomly Accessed", Proceedings of the 2005 International Symposium on Low Power Electronics and Design (IEEE Cat. No. 05th 8842), Aug. 2005, pp. 393-398.

Huang, Hai et al., "Method and System for Decreasing Power Consumption in Memory Array", DOSS #AUS920050254, Jul. 2005, 5 pages.

Park, Jin H. et al., "Coarse Grained Power Management", Proceedings of the International Conference on Embedded Systems and Applications, ESA, 2003, pp. 248-254.

Nasr, Rami Marwan, "FBSIM and the Fully Buffered DIMM Memory System Architecture", Thesis, 2005, 138 pages.

Lin et al., "DRAM-Level Prefetching for Fully-Buffered DIMM: Design, Performance and Power Saving", ISPASS, 2007, pp. 1-36.

"Quad-Core and Dual-Core Intel Xeon Processor-based Two-Processor Workstations", Intel, see "fully buffered DIMM technology", Oct. 5, 2006, p. 8.

John, Lizy Kurian, "VaWiRAM: A Variable Width Random Access Memory Module", 9th International Conference on VLSI Design, Jan. 1996, pp. 219-224.

Woodacre et al., "The SGI Altix 3000 Global Shared-Memory Architecture", Silicon Graphics, Incorporated, White Paper, 2003.

Haas et al., "Fully-Buffered DIMM Technology Moves Enterprise Platforms to the Next Level", Technology @ Intel Magazine, Mar. 2005, pp. 1-7.

Arimilli et al., "Asynchronous Generation of DRAM Controls from Micro Channel Signals", IBM Technical Disclosure, No. 6, 1992, p. 372.

Howell, J.H., "Dual-Port Control Signal Generator", IBM Technical Disclosure, 1988, pp. 102-104.

Karp et al., "Clock Synchronization Method Speeds Processor Access to Memory", IBM Technical Disclosure, yvol. 38, No. 11, 1995, pp. 7-8.

U.S. Appl. No. 11/613,363, filed Dec. 20, 2006, Pham et al.
U.S. Appl. No. 11/848,309, filed Aug. 31, 2007, Gower et al.
U.S. Appl. No. 11/850,190, filed Sep. 5, 2007, Gower et al.
U.S. Appl. No. 11/848,312, filed Aug. 31, 2007, Gower et al.
U.S. Appl. No. 11/850,290, filed Sep. 5, 2007, Gower et al.
U.S. Appl. No. 11/848,318, filed Aug. 31, 2007, Gower et al.
U.S. Appl. No. 11/848,322, filed Aug. 31, 2007, Gower et al.
U.S. Appl. No. 11/848,342, filed Aug. 31, 2007, Gower et al.
U.S. Appl. No. 11/848,349, filed Aug. 31, 2007, Gower et al.
U.S. Appl. No. 11/850,353, filed Sep. 5, 2007, Gower et al.
U.S. Appl. No. 11/848,354, filed Aug. 31, 2007, Gower et al.
U.S. Appl. No. 12/018,926, filed Jan. 24, 2008, Gower et al.
U.S. Appl. No. 12/019,071, filed Jan. 24, 2008, Brittain et al.
U.S. Appl. No. 12/019,043, filed Jan. 24, 2008, Brittain et al.
U.S. Appl. No. 12/019,095, filed Jan. 24, 2008, Brittain et al.
U.S. Appl. No. 12/018,952, filed Jan. 24, 2008, Brittain et al.
U.S. Appl. No. 12/019,141, filed Jan. 24, 2008, Arimilli et al.
U.S. Appl. No. 12/018,972, filed Jan. 24, 2008, Brittain et al.
U.S. Appl. No. 11/848,309, Image File Wrapper printed from PAIR on May 19, 2010, 3 pages.
U.S. Appl. No. 11/848,312, Image File Wrapper printed from PAIR on May 19, 2010, 2 pages.
U.S. Appl. No. 11/848,322, Image File Wrapper printed from PAIR on May 19, 2010, 3 pages.
U.S. Appl. No. 11/848,342, Image File Wrapper printed from PAIR on May 19, 2010, 3 pages.
U.S. Appl. No. 11/848,349, Image File Wrapper printed from PAIR on May 19, 2010, 2 pages.
U.S. Appl. No. 11/848,354, Image File Wrapper printed from PAIR on May 19, 2010, 2 pages.
U.S. Appl. No. 11/850,190, Image File Wrapper printed from PAIR on May 19, 2010, 2 pages.
U.S. Appl. No. 11/850,290, Image File Wrapper printed from PAIR on May 19, 2010, 2 pages.
U.S. Appl. No. 11/850,353, Image File Wrapper printed from PAIR on May 19, 2010, 2 pages.
U.S. Appl. No. 12/018,926, Image File Wrapper printed from PAIR on May 19, 2010, 2 pages.
U.S. Appl. No. 12/018,952, Image File Wrapper printed from PAIR on May 19, 2010, 2 pages.
U.S. Appl. No. 12/018,972, Image File Wrapper printed from PAIR on May 19, 2010, 3 pages.
U.S. Appl. No. 12/019,043, Image File Wrapper printed from PAIR on May 19, 2010, 2 pages.
U.S. Appl. No. 12/019,071, Image File Wrapper printed from PAIR on May 19, 2010, 2 pages.
U.S. Appl. No. 12/019,095, Image File Wrapper printed from PAIR on May 19, 2010, 2 pages.
U.S. Appl. No. 12/019,141, Image File Wrapper printed from PAIR on May 19, 2010, 4 pages.
U.S. Appl. No. 11/848,318, Image File Wrapper printed from PAIR on May 19, 2010, 3 pages.
Interview Summary mailed Jun. 1, 2010 for U.S. Appl. No. 11/848,309; 3 pages.
Interview Summary mailed Jun. 1, 2010 for U.S. Appl. No. 11/848,312; 3 pages.
Notice of Allowance mailed Jun. 10, 2010 for U.S. Appl. No. 11/848,322; 10 pages.
Response to Office Action filed May 25, 2010 for U.S. Appl. No. 11/848,312; 12 pages.
Response to Office Action filed Jun. 3, 2010 for U.S. Appl. No. 11/848,309; 19 pags.
Notice of Allowance mailed Jul. 15, 2010 for U.S. Appl. No. 11/848,318, 9 pages.
Notice of Allowance mailed Aug. 16, 2010 for U.S. Appl. No. 11/848,312, 8 pages.
Notice of Allowance mailed Aug. 19, 2010 for U.S. Appl. No. 11/848,309, 15 pages.
Office Action mailed Aug. 31, 2010 for U.S. Appl. No. 12/019,071, 22 pages.
Office Action mailed Aug. 31, 2010 for U.S. Appl. No. 12/019,095, 21 pages.
Office Action mailed Sep. 01, 2010 for U.S. Appl. No. 12/019,043, 21 pages.
Office Action mailed Sep. 02, 2010 for U.S. Appl. No. 12/018,952, 21 pages.
Office Action mailed Sep. 29, 2010 for U.S. Appl. No. 12/018,972, 27 pages.

* cited by examiner

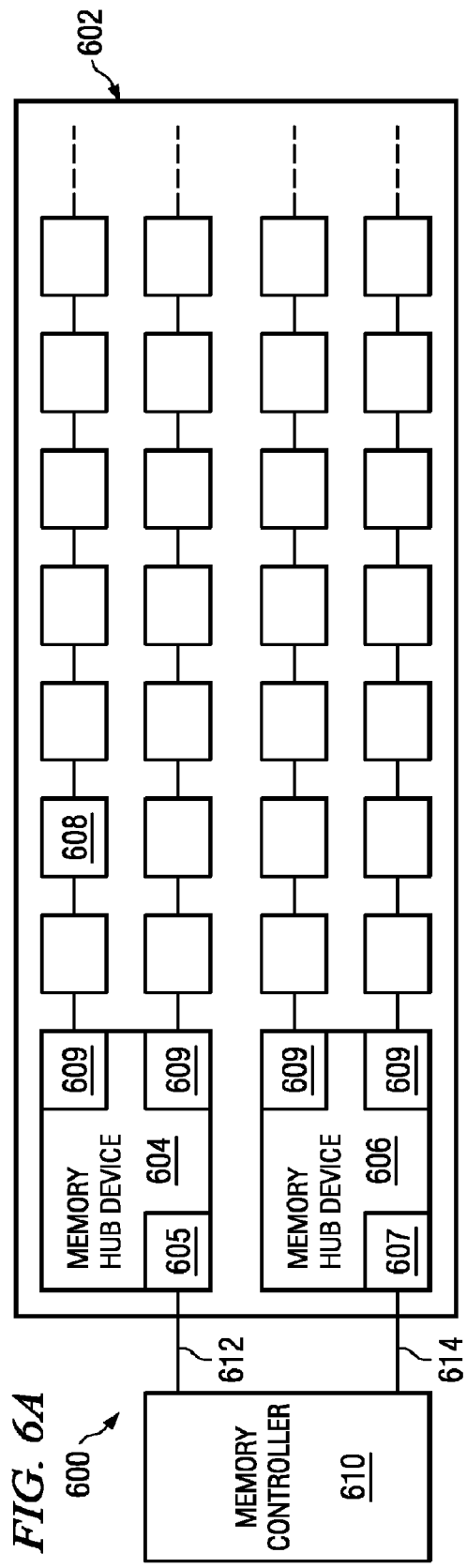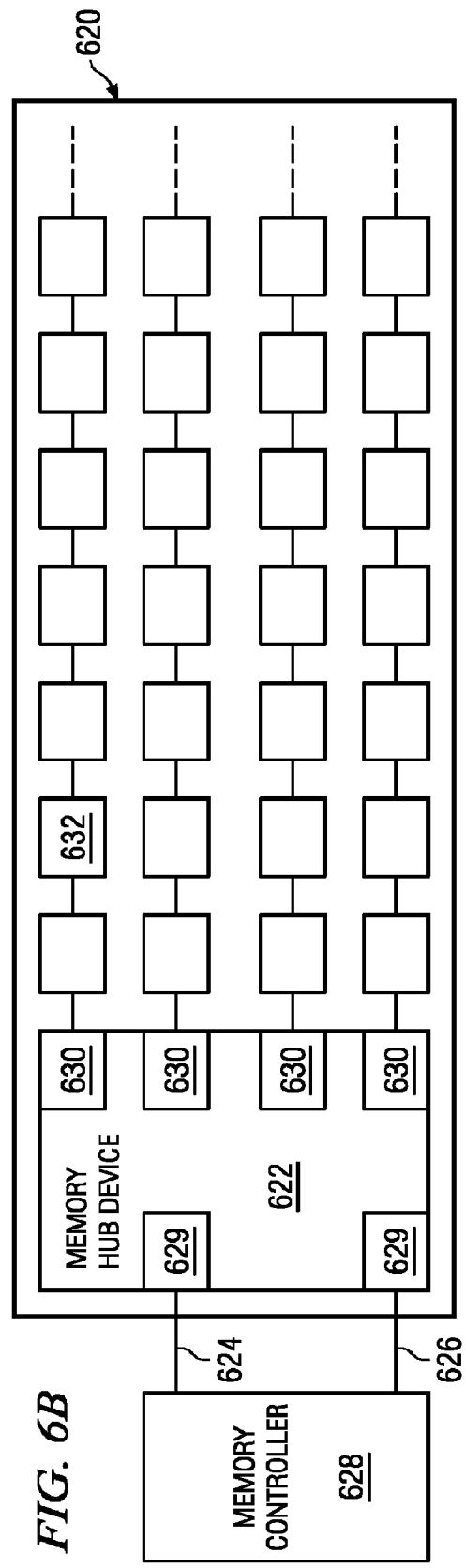

US 7,899,983 B2

BUFFERED MEMORY MODULE SUPPORTING DOUBLE THE MEMORY DEVICE DATA WIDTH IN THE SAME PHYSICAL SPACE AS A CONVENTIONAL MEMORY MODULE

GOVERNMENT RIGHTS

This invention was made with Government support under DARPA, HR0011-07-9-0002. THE GOVERNMENT HAS CERTAIN RIGHTS IN THIS INVENTION.

BACKGROUND

1. Technical Field

The present application relates generally to an improved data processing system. More specifically, the present application is directed to a buffered memory module supporting double the memory device data width in the same physical space as a conventional memory module.

2. Description of Related Art

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-before-failure (MTBF), in addition to offering additional functions, increased performance, increased storage, lower operating costs, etc. Other frequent customer requirements further exacerbate the memory system design challenges, and include such items as ease of upgrade and reduced system environmental impact, such as space, power, and cooling.

Furthermore, with the movement to multi-core and multi-threaded processor designs, new requirements are being made for the memory subsystem to supply very large data bandwidths and memory capacity into a single processor socket. At a system level, the bandwidth and memory capacity available from the memory subsystem is directly proportional to the number of dual in-line memory modules (DIMMs) that are installed in the system and the number of independent memory channels connected to the DIMMs. Due to the large increases in the number of cores and threads in a processor socket, a system that at one time only required four or eight DIMMs on each processor socket now may require two to four times the number of independent DIMMs. This in turn would drive system packaging to larger and larger packages. In a dense computing environment where there may be hundreds of processor racks, increasing the package size for a system may not be a viable option.

A conventional fully buffered DIMM includes a memory hub device that interfaces between a memory controller of a processor and dynamic random access memory (DRAM) on the DIMM. This memory hub device includes a high-frequency, high-bandwidth bus structure or memory channel between the memory hub device and the processor. The memory hub device also includes a second high-frequency, high-bandwidth point-to-point interface to the next DIMM in a daisy-chain configuration and a lower-bandwidth multi-drop eight-byte interface to the DRAMs on the DIMM. The bandwidth capability of the memory channel that is feeding the DIMM is significantly larger than the bandwidth capability of the interface to the DRAMs on the DIMM creating a mismatch of bandwidths.

A mismatch of bandwidths normally results in loss of performance in the system. That is, even though the processor is able to send access requests to the memory hub device using the high-bandwidth memory channel, the memory hub device is limited in its access to the DRAMS by lower-bandwidth memory interface. The industry standard solution to this is to install another DIMM on the daisy-chain interface. With this configuration the bandwidth from two memory hub devices may be combined to more efficiently use the bandwidth of the channel to the memory controller. However, the link between the memory hub devices results in added latency on read operations, which results in lower system performance. Additionally, there are many system configurations that do not have the physical space for a second DIMM socket. Without the space for the second socket there is no solution to efficiently use the bandwidth on the memory channel. In addition, for systems that target very dense computing environments, there may not be enough DIMM connectors for all the memory channels on the processor interface, let alone providing multiple DIMMs per memory channel.

SUMMARY

In order to increase the memory bandwidth through a memory module, the illustrative embodiments implement multiple memory device data interfaces in a memory hub device of a memory module that interfaces between a memory controller of a processor and memory devices on the memory module. Providing multiple memory device data interfaces on the memory hub device results in a more even match between the bandwidth on a memory channel coupled to the memory module and the bandwidth of the memory device data interface of a single memory module. Additionally, the multiple memory device data interfaces on the memory hub device also double the storage capacity of the memory module.

The illustrative embodiments provide mechanisms for enhancing the memory bandwidth available through a buffered memory module. One illustrative embodiment provides multiple memory device data interfaces in a memory hub device of a memory module that interfaces between a memory controller of a processor and memory devices on the memory module. Another illustrative embodiment provides for using a high-frequency, high-bandwidth point-to-point interface or memory channel that generally connects a memory hub device to another memory module in a daisy-chain configuration as an independent memory channel onto the memory module. A further illustrative embodiment provides a memory module stacking implementation that pins out data buses of two stacked four-bit wide memory devices separately but electrically connects the chip select signals of the two four-bit wide memory devices together for parallel access.

The illustrative embodiments provide a memory system that comprises a memory hub device integrated into a memory module. The illustrative embodiments provide a first memory device data interface integrated in the memory hub device that communicates with a first set of memory devices integrated in the memory module. The illustrative embodiments provide a second memory device data interface integrated in the memory hub device that communicates with a second set of memory devices integrated in the memory module. In the illustrative embodiments, the first set of memory devices are spaced in a first plane and coupled to a substrate of the memory module. In the illustrative embodiments, the second set of memory devices are spaced in a second plane above the first plane and coupled to the substrate. In the illustrative embodiments, data buses of the first set of memory devices are coupled to the substrate separately from data buses of the second set of memory devices.

In the illustrative embodiments, at least one of chip select signals, clock enable signals, calibration signals, or on-die termination signals of the first set of memory devices and the second set of memory devices are coupled together to the substrate. In the illustrative embodiments, the second set of memory devices may be stacked over the first set of memory devices.

In the illustrative embodiments, a first memory access request may be processed via the first memory device data interface and a second memory access request may be processed via the second memory device data interface at substantially a same time in a parallel manner using a chip select signal.

In the illustrative embodiments, the memory system may further comprise a memory channel for communicating with the first set of memory devices and second set of memory devices via the memory hub device. In the illustrative embodiments, the memory system may further comprise a memory controller in communication with the memory channel. In the illustrative embodiments, the memory controller may generate memory access requests, receives memory access requests, and responds to memory access requests.

In the illustrative embodiments, the memory hub device may further comprise a memory hub controller coupled to the first memory device data interface and the second memory device data interface. In the illustrative embodiments, the memory hub controller may respond to access request packets from one of a memory controller external to the memory module or a downstream memory hub device of another memory module by responsively driving one or more of the first set of memory devices or the second set of memory devices using a memory device address and control bus and directing one of a read data flow selector or a write data flow selector.

In the illustrative embodiments, the memory hub controller may drive the read data flow selector to a multiplexer of the memory hub device to select outputting read data directly, from one of the first memory device data interface or the second memory device data interface, or output read data from a read data queue. In the illustrative embodiments, the memory hub controller may drive the write data flow selector to a first multiplexer and a second multiplexer for selecting either a direct input from a link interface of the memory hub device or an input from a write data queue of the memory hub device. In the illustrative embodiments, the first multiplexer may provide an output to the first memory device data interface and the second multiplexer may provide an output to the second memory device data interface.

In the illustrative embodiments, the memory hub controller, in response to a write access request packet, may issue a first memory write access request to the first set of memory devices via the first memory device data interface and substantially immediately issue a second memory write access request to the second set of memory devices via the second memory device data interface. In the illustrative embodiments, the memory hub controller, in response to a read access request packet, may issue a first memory read access request to the first set of memory devices via the first memory device data interface and substantially immediately issue a second memory read access request to the second set of memory devices via the second memory device data interface.

In the illustrative embodiments, read data from the first memory read access request and the second memory read access request may be directly transferred to the memory controller. In the illustrative embodiments, read data from the first memory read access request and the second memory read access request may be queued prior to be transferred to the memory controller.

In the illustrative embodiments, the memory system may be part of a data processing device. In the illustrative embodiments, the memory system may be a main memory of a data processing device. In the illustrative embodiments, the memory module may be a dual in-line memory module (DIMM) or a single in-line memory module (SIMM).

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 6A and 6B depict the use of a high-frequency, high-bandwidth point-to-point interface or memory channel within a memory system that generally connects to another memory module as an independent memory channel onto the memory module in accordance with an illustrative embodiment;

DETAILED DESCRIPTION OF THE ILLUSTRATIVE EMBODIMENTS

Figure 1:
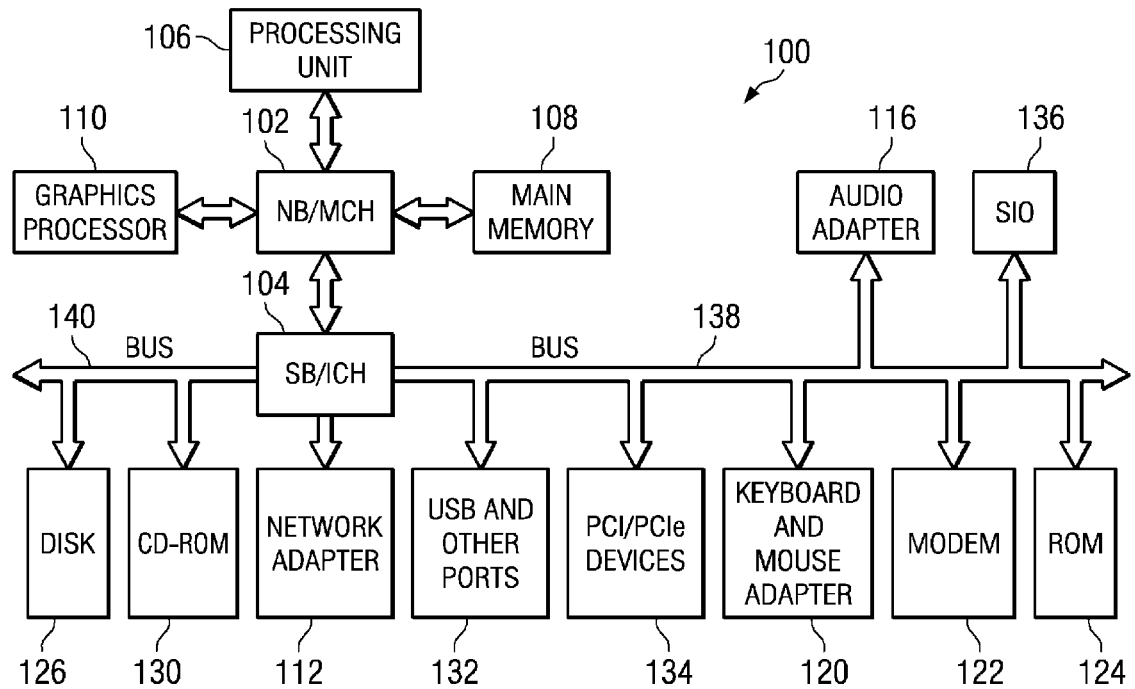
FIG. 1 is a block diagram of an exemplary data processing system in which aspects of the illustrative embodiments may be implemented.

The illustrative embodiments provide mechanisms for enhancing the memory bandwidth available through a buffered memory module. As such, the mechanisms of the illustrative embodiments may be used with any of a number of different types of data processing devices and environments. For example, the memory system of the illustrative embodiments may be utilized with data processing devices such as servers, client data processing systems, stand-alone data processing systems, or any other type of data processing device. Moreover, the memory systems of the illustrative embodiments may be used in other electronic devices in which memories are utilized including printers, facsimile machines, storage devices, flashdrives, or any other electronic device in which a memory is utilized. In order to provide a context for the description of the mechanisms of the illustrative embodiments, and one example of a device in which the illustrative embodiments may be implemented, FIG. 1 is provided hereafter as an exemplary diagram of data processing environment in which embodiments of the present invention may be implemented. It should be appreciated that FIG. 1 is only exemplary and is not intended to assert or imply any limitation with regard to the environments in which aspects or embodiments of the present invention may be implemented. Many modifications to the depicted environments may be made without departing from the spirit and scope of the present invention.

With reference now to FIG. 1, a block diagram of an exemplary data processing system is shown in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 100 (Java is a trademark of Sun Microsystems, Inc. in the United States, other countries, or both).

As a server, data processing system 100 may be, for example, an IBM® eServer™ System p™ computer system, running the Advanced Interactive Executive (AIX™) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. In other illustrative embodiments, data processing device 100 may be any type of digital commercial product that utilizes a memory system in accordance with the illustrative embodiments, as discussed hereafter. For example, data processing device 100 may be a printer, facsimile machine, flash memory device, wireless communication device, game system, portable video/music player, or any other type of consumer electronic device. Essentially, data processing system 100 may be any known or later developed data processing system without architectural limitation.

Furthermore, data processing device 100 may employ many different types of memory for main memory 108. In some illustrative embodiments, main memory 108 may be a memory module, such as a dual in-line memory module (DIMM), single in-line memory module (SIMM), or other memory module or card structure. In general, a DIMM refers to a small circuit board or substrate that is comprised primarily of random access memory (RAM) integrated circuits, or dies, on one or both sides, i.e. planar surfaces, of the circuit board/substrate with signal and/or power pins along both sides of a common edge of the circuit board/substrate. A SIMM refers to a small circuit board or substrate composed primarily of RAM integrated circuits, or dies, on one or both sides, i.e. planar surfaces, of the circuit board/substrate and pins generally along both long edges, with each pin connected to the pin directly (or slightly offset from the pin) on the adjacent side.

As mentioned above, main memory 108 may be accessed by NB/MCH 102 using a high-frequency, high-bandwidth point-to-point interface or other known interfaces such as multi-drop. The interface on the memory module however is limited to the lower-bandwidth multi-drop eight-byte interface to the memory devices of the contemporary memory module. Thus, the illustrative embodiments provide mechanisms for enhancing the memory bandwidth available through a memory module. While the preferred embodiment is directed to a DIMM, the mechanisms described in the illustrative embodiment may be used with other memories, such as a SIMM, a memory card, a QUIMM (Quad inline memory module), or other carrier or assembly having electrical and dimensional attributes optimally suited for a given system environment.

In order to increase the memory bandwidth through a memory module, the illustrative embodiments implement multiple memory device data interfaces in a memory hub device of a memory module that interfaces between a memory controller of a processor and memory devices on the memory module. Providing multiple memory device data interfaces on the memory hub device results in a more even match between the bandwidth on a memory channel coupled to the memory module and the bandwidth of the memory device data interface of a single memory module. Additionally, the multiple memory device data interfaces on the memory hub device also double the storage capacity of the memory module.

The illustrative embodiment also provide for using a high-frequency, high-bandwidth point-to-point interface or memory channel that generally connects a memory hub device to another memory module in a daisy-chain configuration as an independent memory channel onto the memory module. Another illustrative embodiment provides a memory module stacking implementation that pins out data buses of two stacked four-bit wide memory devices separately but electrically connects the chip select signals of the two four-bit wide memory devices together for parallel access. A pin out is a term used in electronics to describe how an electrical connector, such as a memory module, is wired. An electrical connector typically consists of several electrical contacts or pins that can be used to carry electrical power or signals. Due to the wide variety of applications and manufacturers, a wide selection of electrical connectors exists with different types and numbers of contacts or pins. The pin out of an electrical connector identifies each individual pin. Proper identification of pins ensures that the signals and power are transmitted across the electrical connectors.

Figure 2:
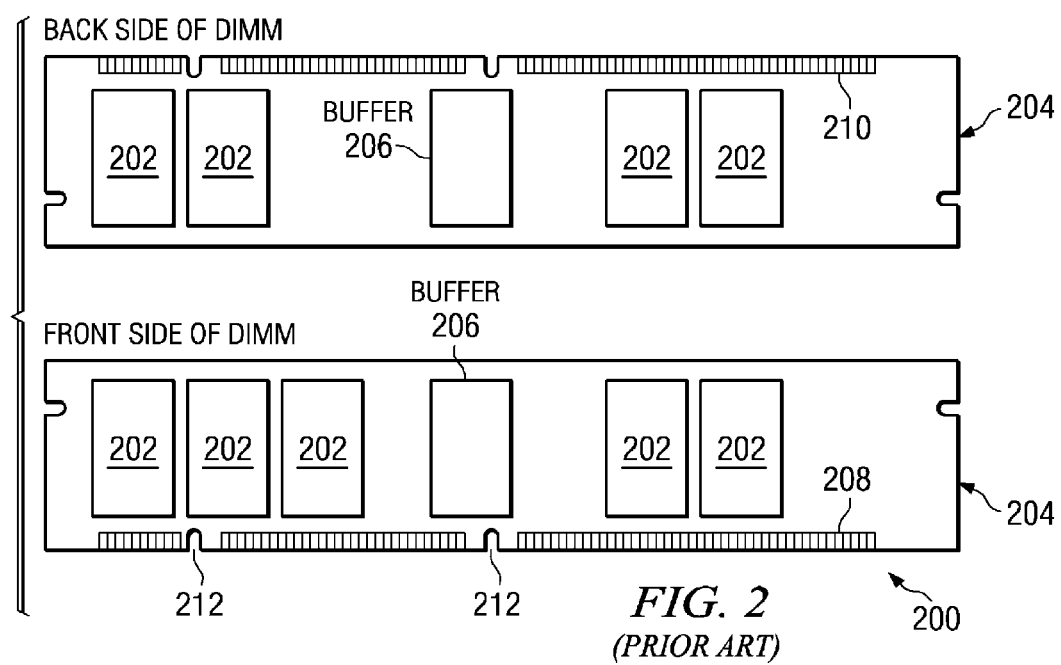
FIG. 2 depicts an exemplary synchronous memory module, such as a dual in-line memory module (DIMM)

FIG. 2 depicts an exemplary memory module, such as a dual in-line memory module (DIMM). Memory module 200 depicted in FIG. 2 may be part of main memory in a data processing device or system, such as main memory 108 in data processing system 100 of FIG. 1. Memory module 200 depicts a front planar side and a back planar side of a DIMM design for nine synchronous dynamic random access memory (SDRAM) chips 202, which may also be referred to as memory devices. In the depiction of FIG. 2, the backside view of the DIMM (top of drawing) may be rotated down such that the notches, or keys, on the edges are aligned with the notches, or keys, on the edges of the front side view of the DIMM (bottom of drawing).

In the depicted example, SDRAM chips 202 are arranged on the front and back sides of printed circuit board 204 with corresponding buffer 206 centrally disposed on each side. Thus, SDRAM chips 202 may be referred to as being disposed on a right side and a left side, relative to buffer 206, of the front side and on a right side and a left side, relative to buffer 206, of the back side. When viewed as an assembled memory module, connector pins 208 on the front side of printed circuit board 204 are disposed along a common edge with connector pins 210 on the back side of printed circuit board 204.

Keys 212 provide a positive mechanical interlock for systems solely supporting DRAM or SDRAM. In the exemplary embodiment, systems supporting both DRAM and SDRAM would have no connector key in this position. A side edge key may be used to inform the controller of the type of memory technology employed, e.g., flash write, EPROM, etc. or in other embodiments, may be used to identify operating voltage or other operational features for which a mechanical means is optimal to prevent system or module damage. Memory module 200 may be coupled to a memory controller of a data processing system, which controls the reading and writing of data from and to memory module 200. The DIMM depicted in FIG. 2 includes 168 pins in the exemplary illustration, whereas subsequent DIMMs may be constructed with pin-counts ranging from 100 pins to over 300 pins, and in alternate exemplary embodiments, pins may be placed on more than one edge to permit interconnection to alternate interfaces (e.g. test, diagnostic, characterization, add-on memory/extended memory, etc).

Figure 3:
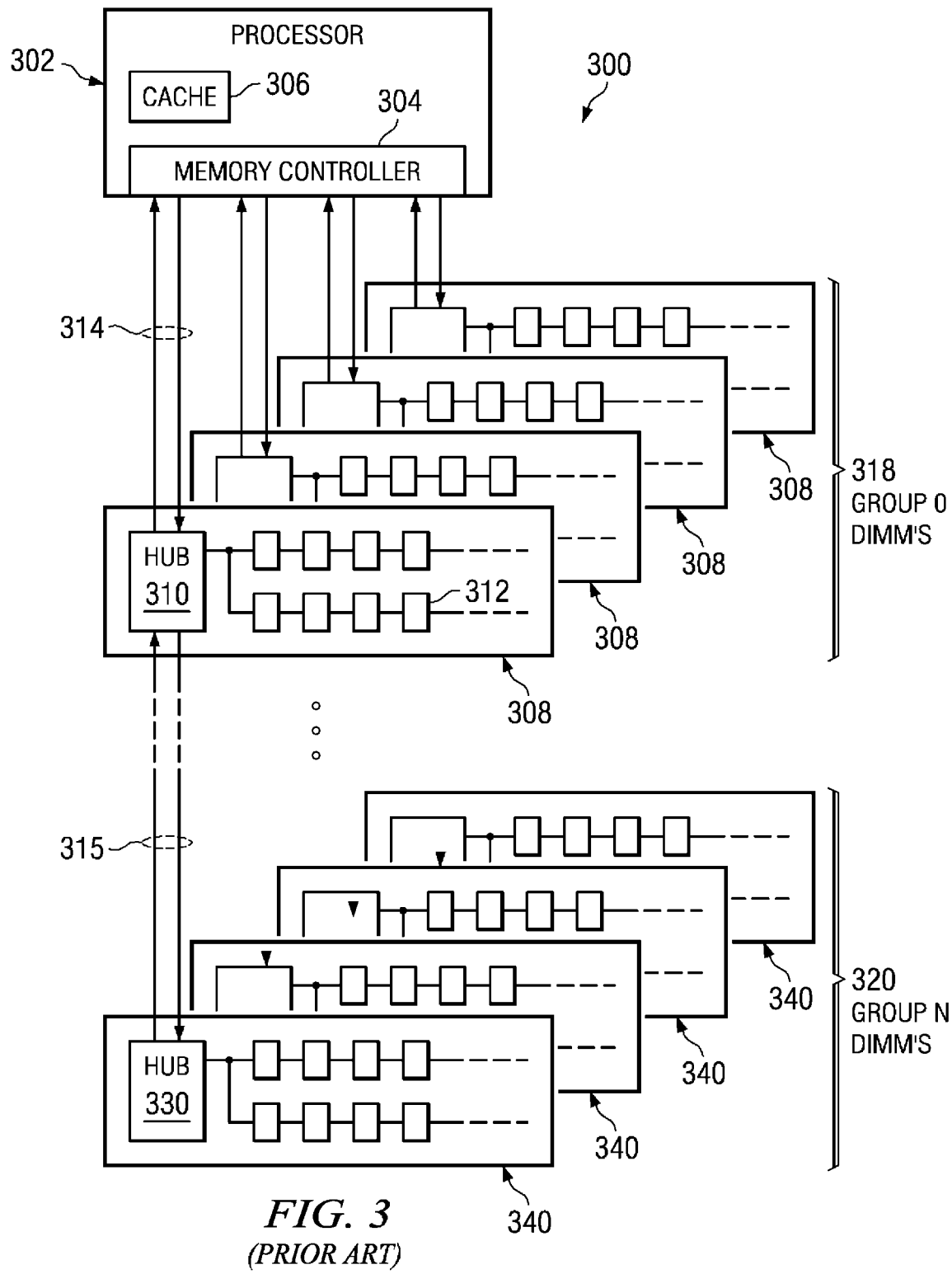
FIG. 3 illustrates an exemplary data processing system coupled to a subsystem of memory modules.

FIG. 3 illustrates an exemplary data processing system coupled to a subsystem of memory modules. Data processing system 300 includes processor 302, with memory controller 304 and cache 306 integrated thereon, and one or more memory modules 308, such as memory module 200 of FIG. 2. Each of the memory modules 308 may include a memory hub device 310 connected to one or more memory devices 312. Each of memory modules 308 connects via bus structures 314 or memory channels that are connected to processor 302 through a cascade interconnect bus structure, which may also be referred to as a hub-and-spoke topology. Memory controller 304 is interconnected to memory hub devices 310 of the memory modules 308 via one or more memory channels 314. Memory hub devices 310 may also be interconnected to other memory hub devices 330 of other memory modules 340 in an nth group of DIMMs 320 or to a standalone repeater hub device using memory channel 315.

Each memory hub device 310 and 330 provides one or more low speed connection(s) to groups of memory devices 312 following, for example, the fully buffered DIMM standard. The connections to the memory devices may include both common and independent signals to the one or more memory devices, with the signals comprising one or more of data, address, command, control, status, reset, and other signals present in contemporary or future memory devices. Multiple identically configured memory modules 308 are logically grouped together into module groups 318 and 320, and may be operated on in unison or with a subset of the modules selected based on the commands issued by memory controller 304 to provide for optimal latency, bandwidth, and error correction effectiveness for system memory cache line transfer, diagnostics, and other communication modes to the memory storage.

In the exemplary embodiment, memory controller 304 translates system requests for memory access into packets according to a memory hub device communication protocol. Typically, memory write packets contain at least a command, address, and associated data. Memory read packets typically contain at least a command and address, and imply that an expected packet will be returned which contains the requested data and/or information related to the read request. Memory controller 304 sends the memory write packets and memory read packets to memory hub device 310 of a memory module 308. Memory hub device 310 routes the packets to a corresponding memory device 312 associated with memory hub device 310 or another memory hub device 330 of another memory module 340, or a standalone repeater hub device. The details of how memory hub device 310 may route the packets in this manner will be provided with reference to FIG. 4 hereafter.

Figure 4:
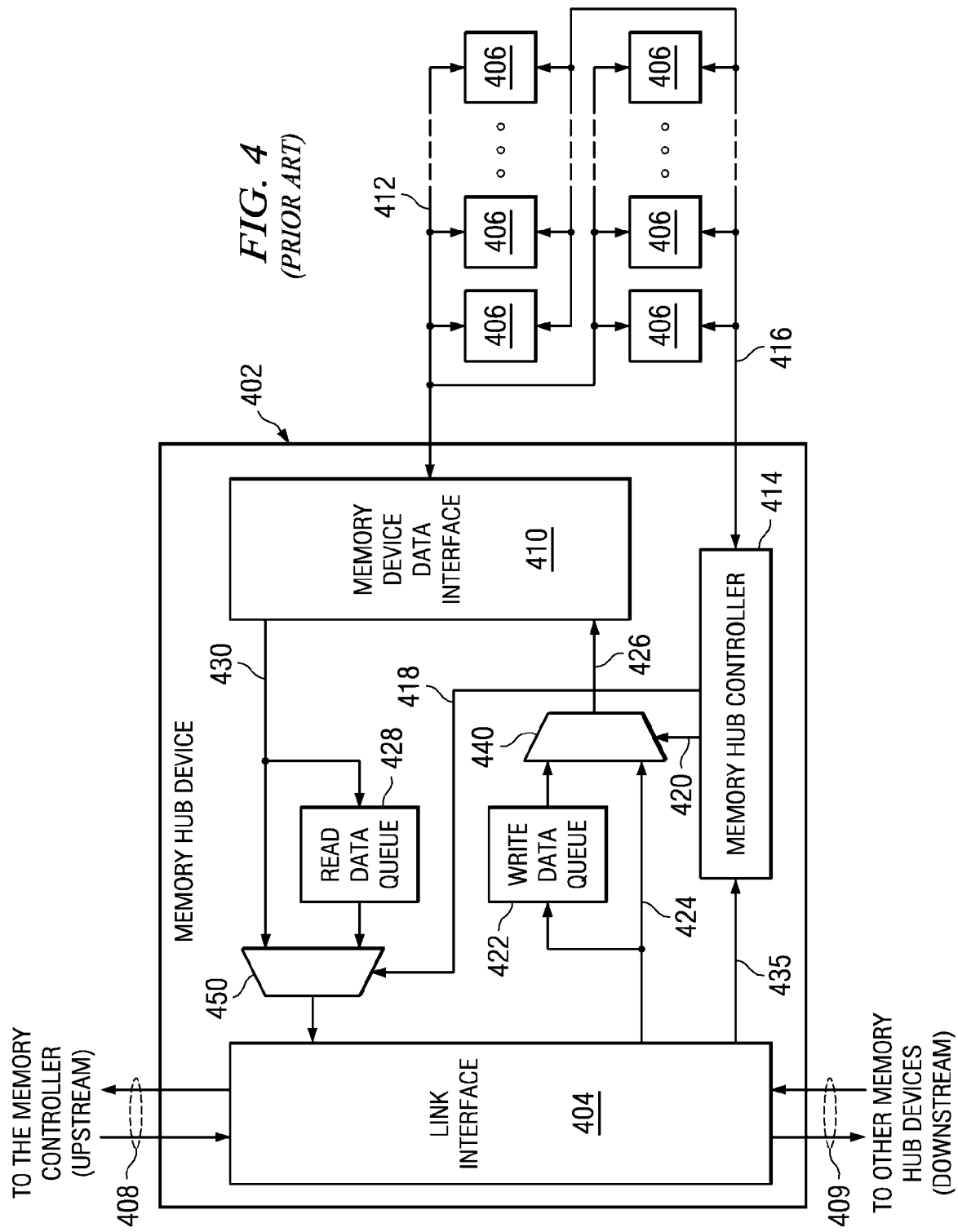
FIG. 4 depicts an exemplary block diagram of a memory hub device of a memory module.

FIG. 4 depicts an exemplary block diagram of a memory hub device of a memory module. Memory hub device 402, such as memory hub device 310 of FIG. 3, may be connected to a memory controller (not shown), such as memory controller 304 of FIG. 3, through memory channel 408, which may be a multi-drop bus structure, point-to-point bus structure, or the like, that may further include a cascade connection to one or more additional memory hub devices or standalone repeater hub device. In the exemplary embodiment, memory channel 408 is a high bandwidth bus structure on which memory access requests are transmitted and received by the memory controller through the memory channel to and from memory hub device 402.

Exemplary memory hub device 402 comprises link interface 404 that receives high-speed memory access requests from an upstream or downstream memory hub device (not shown) or from a memory controller (not shown) via memory channel 408 or 409. Link interface 404 also provides the means to re-synchronize, translate, and re-drive high-speed memory access requests to memory devices 406 and/or to re-drive the high-speed memory access requests downstream or upstream on memory channel 409 as applicable using known memory system communication protocols. Link interface 404 may also receive read data packets from a downstream or upstream memory hub device (not shown) on memory channel 409. Link interface 404 may select between the read data packets from the downstream or upstream memory hub device and the data from memory devices 406 internal to memory hub device 402 using known memory system communication protocols, and then send the data upstream or downstream on memory channel 408.

Memory hub controller 414 responds to access request packets, i.e. write packets and read packets, by responsively driving memory devices 406 using memory device address and control bus 416. Memory hub controller 414 also controls data flow by directing read data flow selector 418 and write data flow selector 420. Link interface 404 decodes the data packets received from the memory controller and directs the address and command information to memory hub controller 414. Memory write data from link interface 404 may be temporarily stored in write data queue 422 before being provided to multiplexer 440. Alternatively, the memory write data may be directly driven to multiplexer 440 via internal bus 424. Memory hub controller 414 uses the address of the write data and control information from the write packet to control write data flow selector 420 and, thus, multiplexer 440 such that multiplexer 440 sends the memory write data from write data queue 422, where the address specific write data may be stored, or internal bus 424 if the address specific write data is sent directly from link interface 404. The memory write data may then be sent via internal bus 426 to memory device data interface 410. Memory device data interface 410 then sends the memory write data to memory devices 406 via memory device data bus 412. While all of memory devices 406 receive the write data, only the memory device having the address of the write data actually stores the write data. In the exemplary embodiments, memory device data interface 410 is an eight-byte data interface that manages the technology-specific data interface with memory devices 406, and further controls the bi-directional memory device data bus 412. However, memory device data interface 410 may be comprised of more or less bytes based on the application requirements, alternate reliability structures (requiring more or less data bits), mechanical (and other) limitations or the like.

As an example of the command flow for a write command, when the memory controller, such as memory controller 304 of FIG. 3, issues a write command to memory devices 406 on memory hub device 402, the memory controller will transmit both a write command and write data to memory hub device 402 via memory channel 408. Link interface 404 decodes the address information associated with the write data and, if the write data is targeted to memory devices 406, link interface 404 moves the write data to a buffer in write data queue 422. The selection of a buffer may be determined in many ways, such as a first in first out queuing method, a buffer implicitly defined in the write command, or other buffer management implementation. Memory hub device 402 generally stores the write data in write data queue 422 prior to the write command being issued, but, depending on the protocol of memory devices 406 and memory channel 408, some or all of the write data may be transferred directly from link interface 404 to memory device data interface 410 via multiplexer 440 under control of memory hub controller 414 and write data flow selector 420. Memory hub controller 414 uses the address of the write data and write command to control write data flow selector 420 and, thus, multiplexer 440 so that multiplexer 440 sends the memory write data from write data queue 422, where the address specific write data may be stored, or internal bus 424 if the address specific write data is sent directly from link interface 404.

After the write data has been transferred, the memory controller will issue a write command to link interface 404 on memory channel 408. Control logic in link interface 404 will in parallel forward the write command to downstream memory hub devices on memory channel 409 and further decode the write command to determine if the write command is targeted at memory devices 406 attached to memory hub device 402. If the write command is targeted for memory devices 406, link interface 404 forwards the write command to memory hub controller 414 to be executed via internal bus 435. Memory hub controller 414 converts the write command into the correct protocols for memory devices 406 installed on memory module. Memory hub controller 414 sends the write command to memory devices 406 over memory device address and control bus 416. While all of memory devices 406 receive the write data command, only the memory device with the address of the write data actually executes the write command. If the write data is stored in write data queue 422, memory hub controller 414 transfers, at an appropriate time, the write data from write data queue 422 to memory device data interface 410 using write data flow selector 420. Memory device data interface 410 forwards the write data to memory devices 406 on memory device data bus 412.

Memory read data may also be provided from memory devices 406 to memory device data interface 410 via memory device data bus 412. Memory device data interface 410 may provide the memory read data to multiplexer 450 directly via internal bus 430 or indirectly via read data queue 428 and internal bus 430. Multiplexer 450 outputs data to link interface 404 using read data flow selector 418 under control of memory hub controller 414. Memory hub controller 414 uses the address of the read data to control read data flow selector 418 and, thus, multiplexer 450 so that multiplexer 450 sends memory read data from read data queue 428, where the address specific read data may be stored, or internal bus 430 if the address specific read data is to be sent directly to link interface 404. Link interface 404 may then transmit the memory read data upstream on memory channel 408 to a memory controller in a processor as one or more read reply packet(s).

An example of the command flow for a read command, when memory hub device 402 receives a read command on memory channel 408, control logic in link interface 404 will in parallel forward this read command to any downstream memory hub device on memory channel 409, and further decode the read command to determine if the read command is targeted at memory device 406 attached to memory hub device 402. If link interface 404 determines that the read command is targeted for memory hub device 402, link interface 404 forwards the read command using internal bus 435 to memory hub controller 414 to be executed. Memory hub controller 414 converts the read command into the correct protocols for memory devices 406 installed on the memory module. Memory hub controller 414 then sends the read command to memory devices 406 over memory device address and control bus 416. While all of memory devices 406 receive the read data command, only the memory device with the address of the read data actually executes the read command and sends the read data to memory device data interface 410. Memory devices 406 execute the read command and transfer a read data packet to memory device data interface 410 over memory device data bus 412.

Under control of memory hub controller 414, memory device data interface 410 transfers the read data packet to either read data queue 428 or directly to link interface 404 to be transferred back to the memory controller using memory channel 408. Memory hub controller 414 uses the address of the read data to control read data flow selector 418 and, thus, multiplexer 450 so that multiplexer 450 sends the memory read data from read data queue 428, where the address specific read data may be stored, or internal bus 430 if the address specific read data is to be sent directly to link interface 404. If the read data is stored in read data queue 428, memory hub controller 414 will decide when to move the stored data to link interface 404 depending on the state of read data queue 428 and the state of link interface 404. If there is already data in read data queue 428 pending transfer to link interface 404, then memory hub controller 414 directs the new read data to read data queue 428. Memory hub controller 414 directs data out of read data queue 428 in a first in, first out manner. Additionally, if link interface 404 is busy moving data from memory channel 409, then memory hub controller 414 delays the transfer of read data until there is an opening on memory channel 408. Any known method may be used to manage read data queue 428.

The illustrative embodiments provide mechanisms for enhancing the memory bandwidth available through a buffered memory module. One illustrative embodiment provides multiple memory device data interfaces in a memory hub device of a memory module that interfaces between a memory controller of a processor and memory devices on the memory module. Another illustrative embodiment provides for using a high-frequency, high-bandwidth point-to-point interface or memory channel that generally connects a memory hub device to another memory module in a daisy-chain configuration as an independent memory channel onto the memory module. A further illustrative embodiment provides a memory module stacking implementation that pins out data buses of two stacked four-bit wide memory devices separately but electrically connects the chip select signals of the two four-bit wide memory devices together for parallel access.

Figure 5:
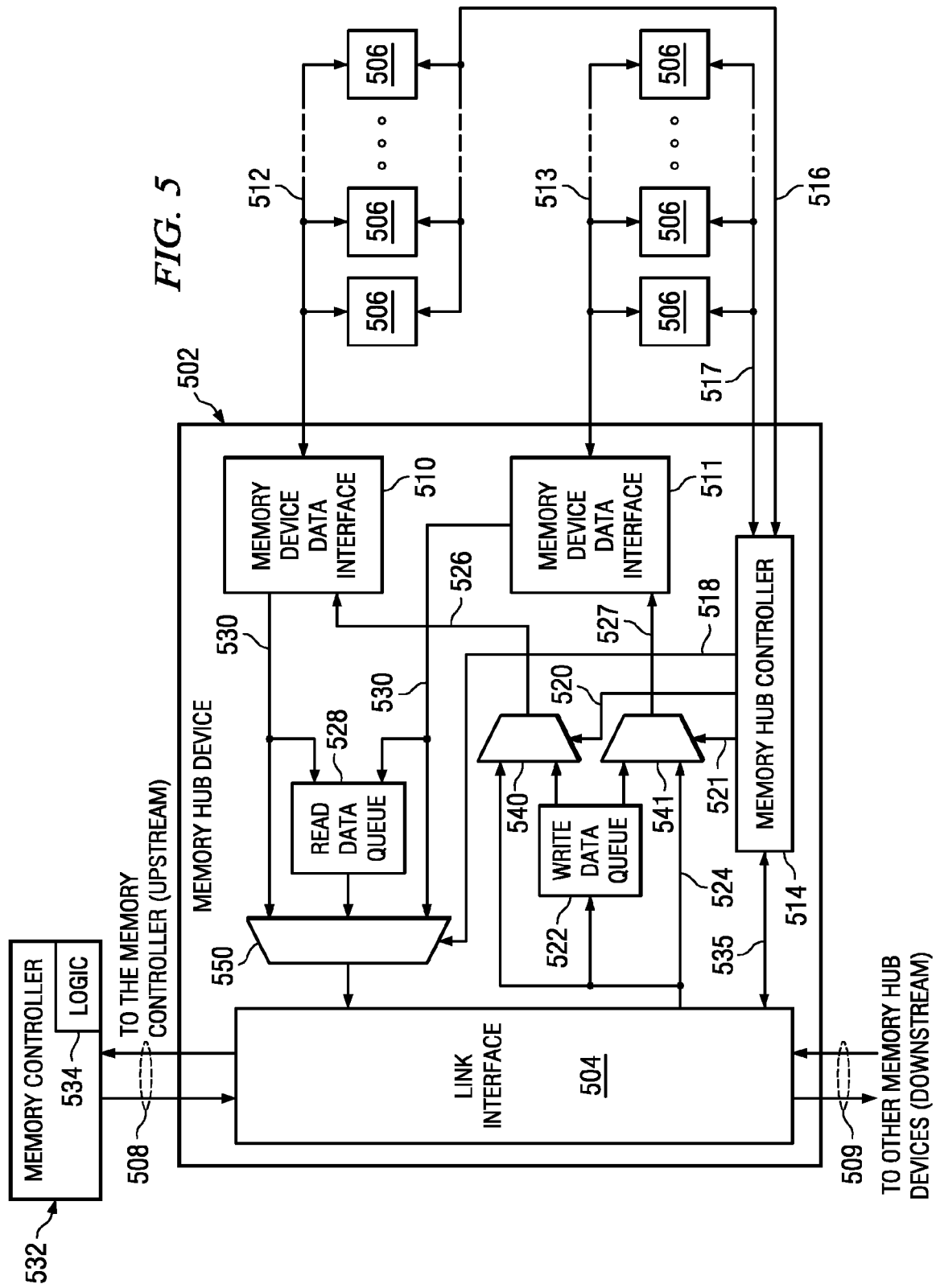
FIG. 5 depicts a buffered memory module within a memory system that comprises multiple memory device data interfaces in accordance with one illustrative embodiment.

FIG. 5 depicts a buffered memory module within a memory system that comprises multiple memory device data interfaces in accordance with one illustrative embodiment. In order to increase the bandwidth from a memory hub device to the memory devices that are coupled to the memory hub, the illustrative embodiments implement a second eight-byte data interface in the memory hub device of the memory module.

With reference to FIG. 5, exemplary memory hub device 502 includes, in addition to the elements particular to the illustrative embodiments, elements that are similar to elements depicted in memory hub device 402 of FIG. 4. Thus, elements in FIG. 5 that are not specifically described as operating differently from elements in FIG. 4 are intended to operate in a similar manner as their corresponding elements in FIG. 4. For example, memory hub device 502 includes link interface 504, memory devices 506, and memory channels 508 and 509, each of which operate in a similar manner to that described with the corresponding elements in FIG. 4. However, in this implementation, the single memory device data interface 410 of FIG. 4 is replaced with memory device data interface 510 and memory device data interface 511. This is a significant and innovative addition that enables dramatic performance benefits on a single module, by better matching the slower memory device data buses 512 and 513 with the high speed communications capability of memory channel 508. In addition, multiple operations can be initiated nearly in parallel (or in parallel, given a modified command structure), thereby dramatically increasing system performance, with minimal memory subsystem power increases (as compared to the use of multiple memory modules/channels, etc).

Also in FIG. 5, memory devices 506 are either divided in half, with one half of memory devices 506 coupled to memory device data interface 510 using bi-directional memory device data bus 512 and the other half of memory devices 506 are coupled to memory device data interface 511 using bi-directional memory device data bus 513, or a second set of memory devices 506 is added to the memory module and connected to the new memory device data interface 511. Memory device data interface 510 and memory device data interface 511 each manage the technology-specific data interface with their portion of memory devices 506 and control their respective one of bi-directional memory device data bus 512 or bi-directional memory device data bus 513. Memory hub controller 514 responds to access request packets by responsively driving memory devices 506 using memory device address and control buses 516 or 517. Memory hub controller 514 also controls data flow by directing read data flow selector 518 and write data flow selectors 520 and 521. Memory hub controller 514 uses the address and control information of the read or write data to control read data flow selector 518 and write data flow selectors 520 and 521 and, thus, multiplexers 550, 540 and 541, respectively.

Further, using write data flow selector 520, memory hub controller 514 may send write data via internal bus 526 to memory device data interface 510 and onto memory devices 506 using bi-directional memory device data bus 512, or using write data flow selector 521, memory hub controller 514 may send write data via internal bus 527 to memory device data interface 511 and onto memory devices 506 using bi-directional memory device data bus 513. By providing memory device data interfaces 510 and 511, memory hub controller 514 may send write data requests at a faster rate, as opposed to known systems where one write access request had to finish prior to a second write access request being issued. That is, while memory device data interface 510 handles one write data request, memory device data interface 511 may simultaneously handle another write data request.

For example, memory controller 532 may send two write requests on memory channel 508 to link interface 504 using a single command transfer (generally over multiple clock cycles) comprising multiple commands/data or multiple transfers (e.g. back-to-back commands and data depending on the command structure of a given structure/application). Link interface 504 decodes the write requests and directs the address and command information to memory hub controller 514 via internal bus 535. Memory hub controller 514 uses the address of the write data to send control signals to multiplexer 540 or 541 using write data flow selectors 520 or 521 to select the correct data for the write command. Memory device data interfaces 510 and 511 receive the write data from multiplexers 540 and 541 via internal buses 526 and 527 and forward the write data to memory devices 506 across memory device data buses 512 and 513. Memory hub controller 514 also sends control signals to memory devices 506 across memory device address and control bus 516 or 517, depending on the address of the write data, to execute the write commands. While all of memory devices 506, which are coupled to the specific memory device address and control bus 516 or 517 on which memory hub controller 514 sent the write command, receive the write data command, only the memory device with the address of the write data actually executes the write command. Thus, while known systems would execute two write commands in series using only memory device data bus 512, the illustrative embodiments execute in parallel using memory device data buses 512 and 513.

Similarly, by providing exemplary memory device data interfaces 510 and 511, read data requests may be sent at a faster rate as well, as opposed to previous implementations where only one read request could be issued at a time. Memory read data from memory devices 506 through memory device data interface 510 or memory device data interface 511 may be queued in the read data queue 528 or directly transferred to link interface 504 via internal bus 530 using multiplexer 550 and read data flow selector 518 under the controller of memory hub controller 514 based on the address of the read data, to be transmitted upstream on memory channel 508 to memory controller 532 in a processor as a read reply packet. Logic 534 in memory controller 532 will schedule the number of read operations that are issued to ensure that read data queue 528 in memory hub device 502 is not overrun with data. In the exemplary embodiment, memory controller 532 manages the number of read operations by tracking the number of read operations sent to memory hub device 502 and the number of read data packets that it has received from memory hub device 502. Given a finite number of read data queue locations, memory controller 532 limits the number of outstanding read operations, which are read operations that memory controller 532 has not received read data for, so that there is always space in read data queue 528 for the read operations in flight.

For example, memory controller 532 may send two read access requests on the memory channel 508 to link interface 504 using a single command transfer (generally over multiple clock cycles) comprising multiple commands/data or multiple transfers (e.g. back-to-back commands and data depending on the command structure of a given structure/application). Link interface 504 decodes and the read access requests and sends the address and command information to memory hub controller 514. Memory hub controller 514 generates control signals for memory devices 506 and sends the control signals to memory devices 506 across memory device address and control buses 516 and 517, depending on the address of the read data. While all memory devices 506, which are coupled to the specific memory device address and control bus 516 or 517 on which memory hub controller 514 sends the read command, receive the read data command, only the memory device with the address of the read data actually executes the read command and sends the read data to memory device data interface 510. To complete the read access request, memory devices 506 send the requested read data to memory device data interfaces 510 and 511 at either a predictable or unpredictable time, based on the memory hub device and system structure, which may include a tagging of data or some other method to permit operability with unpredictable access times. Memory hub controller 514 generates control signals using read data flow selector 518 based on the address of the read data to control multiplexer 550 thereby selecting read data to be read from read data queue 528 or directly from one of memory device data interfaces 510 or 511. Link interface 504 receives the read data from multiplexer 550 via internal bus 530 and sends the read data to memory controller 532 over memory channel 508. Since, in the exemplary embodiment, memory channel 508 may only receive read data from either memory device data interface 510 or 511 at one time, memory hub controller 514 uses read data flow selector 518 to control multiplexer 550 thereby selecting read data from one of the memory device data interfaces to send directly to memory channel 508 and the read data from the other memory device data interface may be temporarily stored in read data queue 528. Once the read data from the first memory device data interfaces has been completely transmitted across memory channel 508, memory hub controller 514 uses read data flow selector 518 to control multiplexer 550 thereby selecting the read data from read data queue 528 to be transmitted across memory channel 508 to memory controller 532.

By providing memory device data interfaces 510 and 511, read data requests and write data requests may be sent to memory hub device 502 at a faster rate, as opposed to previous implementations where only one data request, read or write, could be issued at a time with delay between subsequent accesses in response to the limited memory bandwidth due to the single memory device data interface 510. In addition to the operations listed above, other cases exist such as a memory read request may be issued to memory hub device 502 that targets one of memory device data interfaces 510 or 511 and at the same time a memory write request is issued to memory hub device 502 that targets the other one of memory device data interfaces 510 or 511. The read and write commands will execute as described above with memory hub controller 514 issuing commands to one memory device data interface to execute a read operation and commands to the second memory device data interface to execute a write operation. The dual memory device data interfaces provide for any combination of two operations to be executed in parallel verses in series in known memory hub devices.

The wider interface provided by bi-directional memory device data buses 512 and 513 results in a more even match between the bandwidth on memory channel 508 and the bandwidth on memory device data interfaces 510 and 511 of a single memory module. The memory module fits in the same socket as a conventional buffered memory module and provides up to two times the available bandwidth in the same physical space in the system than that of a conventional buffered memory module due to the addition of one or more of memory device data interfaces 511 and bi-directional memory device data buses 513, memory device address and control buses 517, etc. Additionally, because memory device data interface 511 and bi-directional memory device data bus 513 are in the same memory hub device with memory device data interface 510 and bi-directional memory device data bus 512, additional latency impacts that are experienced in a memory hub device with a single memory device data interface may be reduced when accessing the memory module. That is, since the bandwidth of memory hub device 502 has been increased by adding memory device data interface 511 and bi-directional memory device data bus 513, the mismatch in bandwidth of memory hub device 502 to the bandwidth of the memory channel has decreased, thereby increasing the rate at which memory hub device 502 may process memory access requests.

Furthermore, with the addition of memory device data interface 511 on memory hub device 502, the storage capacity of the memory module within a memory system may be doubled while maintaining the increased bandwidth described earlier. That is, with a single memory device data interface as described in FIG. 4, the total memory module capacity is determined by the technology and number of memory devices 506 and the desired frequency of operation. Given these parameters only a set number of memory devices 506 may be installed on a given memory module, thus, setting the maximum capacity of that memory module. With the addition of memory device data interface 511 and bi-directional memory device data bus 513, the memory module may support two times the number of memory devices 506 given the same guidelines used in the industry standard memory module. For example, a conventional memory module that includes a single memory device data interface may support 9, 18, 36, 72, or some other quantity of memory devices, as applicable to a system environment. By providing a second memory device data interface, the illustrative embodiments provide capacity for doubling the conventional 9 memory devices to 18 memory devices, the conventional 18 memory devices to 36 memory devices, the conventional 36 memory devices to 72 memory devices, the conventional 72 memory devices to 144 memory devices, and so on.

Additionally, memory hub device 502 may support both a compatibility mode and an enhanced bandwidth mode. In the compatibility mode, memory device data interface 511 and the coupled ones of memory devices 506 appear to memory controller 532 as a second memory module coupled to memory hub device 502. In the compatibility mode, bi-directional memory device data buses 512 and 513 run as independent data buses as they would if they were on two independent memory modules. For example, in the compatibility mode, link interface 504 decodes read commands for memory hub device 502 and read commands for a second memory hub device that would have been attached on memory channel 509. Commands that would have been targeted for memory hub device 502 are directed to memory device data interface 510 and commands targeted for the second memory hub device in the daisy-chain are directed to memory device data interface 511. Memory hub controller 514 manages the data flow on the read commands through read data queue 528 to schedule the returning read data to memory controller 532 so that it would appear like there are two memory hub devices in the system instead of a single memory hub device. This allows current memory controller designs to use this memory module and get the advantages of the added bandwidth per memory module socket, the lower latency of a single memory hub device, and the added capacity in a conventional memory module slot. The memory controller would be informed, generally at power-up, of the structure defined above, and as such, would be aware of the reduced latency when accessing the "second" memory hub (which is not integrated on the first memory hub).

In the enhanced mode, memory hub device 502 may run memory device data interface 510 and memory device data interface 511 as two independent eight-byte memory ports, as described above, or a single sixteen-byte memory port. When running as a single sixteen-byte memory port, data read from memory devices 506 through memory device data interface 510 and memory device data interface 511 is buffered using read data queue 528, which collects the data and feeds it to memory channel 508 through link interface 504. Read data queue 528 is necessary since the read bandwidth from the sixteen-byte memory port interface may be higher than the read bandwidth on memory channel 508. For example, in the enhanced mode, memory hub controller 514 stores read data from both memory device data interfaces 510 and 511 into read data queue 528. Memory hub controller 514 transmits the stored read data from read data queue 528 to link interface 504 at a rate that link interface 504 may accept. The read data stored in read data queue 528 will be sent to link interface 504 in a first in, first out (FIFO) manner. Thus, memory hub controller 514 sends 16 bytes of read data on a first beat of the read access request to memory controller 532 across memory channel 508, followed by a second 16 bytes of read data on a second beat, continuing in this manner until all the read data is transferred. The enhanced mode allows memory controller 532 to better manage the resource on the memory module for higher overall data bandwidth actively using both memory device data interfaces on every command.

Thus, these illustrative embodiments provide a better match between the bandwidth of memory channel 508 and the bandwidth provided by memory device data interface 510 and memory device data interface 511. Additionally, by providing memory device data interface 510 and memory device data interface 511 on a single memory module, the illustrative embodiments provide for doubling the storage capacity of the memory module by allowing the number of memory devices on the memory module to double.

A memory module employing memory hub device 502 of FIG. 5 provides for an interface to a memory controller and an interface to another memory hub device while interfacing to double the number of memory devices. However, it is possible to provide one or more memory hub devices that quadruple the number of memory devices of a single memory module by using the interface normally connected to another memory hub device in another manner. FIGS. 6A and 6B depict the use of exemplary high-frequency, high-bandwidth point-to-point interface or memory channel within a memory system that generally connects to another memory module as an independent memory channel onto the memory module in accordance with an illustrative embodiment.

Turning now to FIG. 6A, memory interface 600 comprises memory module 602 that includes memory hub devices 604 and 606, such as memory hub device 502 of FIG. 5. In memory module 602, each of memory hub devices 604 and 606 are coupled to memory devices 608 using memory device data interfaces 609 in a similar manner to that described in FIG. 5. Memory hub devices 604 and 606 operate in a similar manner to that described in FIG. 5. That is, memory hub devices 604 and 606 respond to access requests from memory controller 610 by writing data to and reading data from memory devices 608.

However, in this illustrative embodiment, instead of link interface 605 of memory hub device 604 being interconnected to memory controller 610 via upstream independent memory channel 612 as well as interconnected to another memory hub device via downstream independent memory channel 614, link interface 605 of memory hub device 604 interconnects only to memory controller 610 using only independent memory channel 612. The illustrative embodiments reassign independent memory channel 614, such that downstream memory channel 509 of FIG. 5, does not connect to memory hub device 606. Rather, memory hub device 606 connects to independent memory channel 614. Thus, memory hub devices 604 and 606 are each independently coupled to memory controller 610 via independent memory channels 612 and 614. By interconnecting memory module 602 with independent memory channels 612 and 614, a conventional memory module socket may provide up to four times the bandwidth and up to four times the memory capacity with a fully equipped memory module, which allows for extremely dense and high performance computer systems.

While exemplary memory interface 600 depicts interconnecting memory hub devices 604 and 606, such as memory hub device 502 described in FIG. 5, the illustrative embodiments also anticipate other designs of a memory hub device employing two independent memory channels and four memory device data interfaces such as that shown in FIG. 6B. In FIG. 6B, exemplary memory module 620 is depicted using memory hub device 622, which include two independent memory channels 624 and 626 coupled to memory controller 628 via link interfaces 629 and four memory device data interfaces 630 each independently coupled to a set of memory devices 632. A first memory channel 624 may be coupled to a first set of two of the four memory device data interfaces 630 while a second memory channel 626 may be coupled to a second set of two of the four memory device data interfaces 630. In this way, the bandwidth to memory devices 632 may be multiplied by up to four relative to a memory module having a memory hub device with only one memory device data interface, such as shown in FIG. 4. Moreover up to four times the number of memory devices may be included in the memory module when compared to the memory module in FIG. 4.

Thus, by using the high-frequency, high-bandwidth point-to-point interface or memory channel that generally connects to another memory module as an independent memory channel onto the memory module, the illustrative embodiments provide the capability of a single memory module having up to four times the bandwidth and up to four times the memory capacity if fully equipped.

Using either the enhanced memory module of FIG. 5, 6A, or 6B may require a larger number of independent memory device data sites on the memory module to support the larger number of memory hub device to memory device data buses that are being driven by the memory hub device(s). A data site is the physical space on a memory module where the memory devices are located. For example, with four eight-byte data interfaces, such as memory device data interfaces 609 of FIG. 6A, a memory module would require physical space or data sites for 72 memory devices. Known memory modules only have data sites for 36 memory devices on a memory module. Thus, for each eight-byte data bus on the memory module, eighteen memory device data sites are required assuming a four-bit wide configuration of the memory device chips. This number of memory device data sites may be reduced in half to nine memory device data sites if an eight-bit wide memory device configuration is used. However, providing an eight-bit wide memory device data site would reduce the reliability of the memory module for some subset of memory device failures.

This reduction in reliability is due to failing mechanisms in a memory device chip where the full memory device chip fails. For a four-bit wide memory device, this results in a four-bit data error to the error correction code in the memory controller. In known systems a four-bit error is generally correctable by the error correction logic so this device failure will not cause a system failure. If the memory device is an eight-bit wide device, the failure will result in an eight-bit data error to the error correction code in the memory controller. In general an eight-bit error is not correctable by standard error correction codes. Although more advanced codes could be designed to correct an eight-bit error they will either require larger data words into the correction logic or more memory devices off the memory module and either of these two options result in additional system costs and complexities.

To avoid a reduction of reliability, high-end systems generally use only four-bit wide memory device chips. For the very dense memory module implementations, a total of 72 memory device data sites are required to populate all the memory device data buses. The physical implementation of such a dense memory module implementation may not be possible due to the available height for the memory module. One solution is to configure the memory devices in a stacked configuration.

Figure 7:
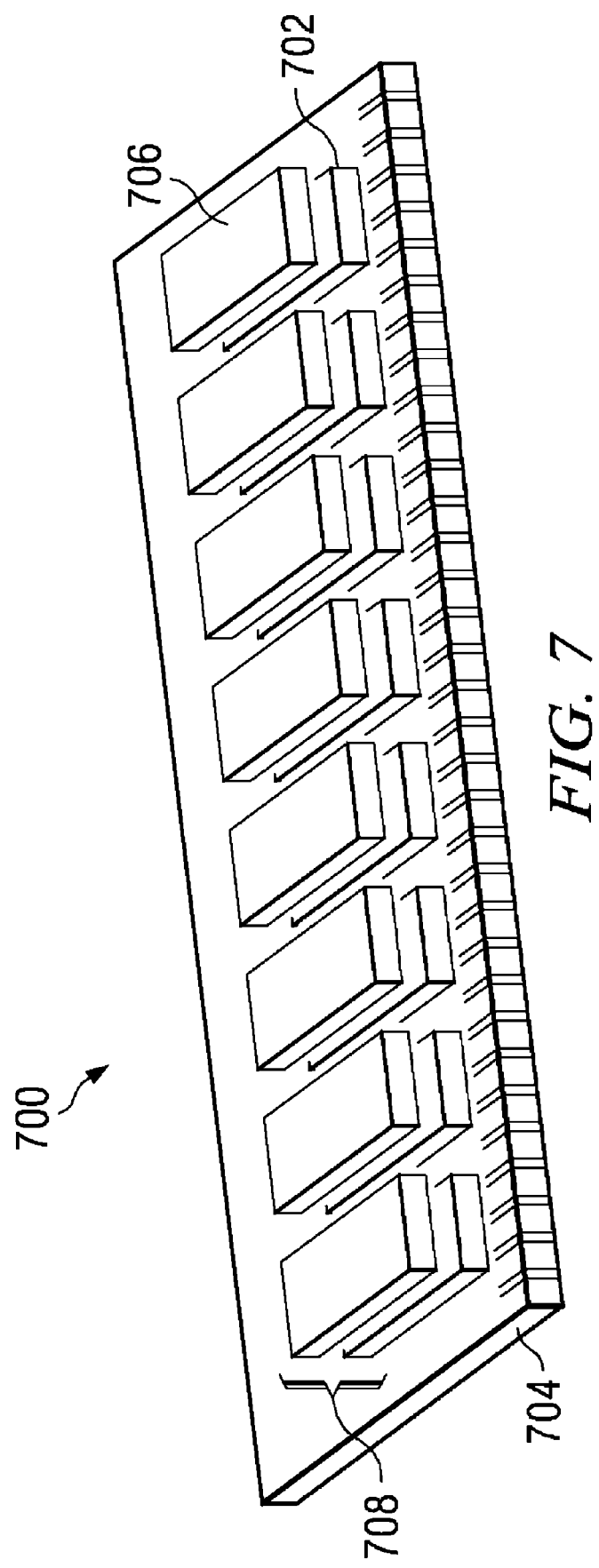
FIG. 7 depicts an exemplary memory device stack configuration in accordance with an illustrative embodiment.

FIG. 7 depicts an exemplary memory device stack configuration in accordance with an illustrative embodiment. In stack configuration 700, a first layer of memory devices 702 are secured to printed circuit board 704, then a second layer of memory devices 706 are secured on top of memory devices 702 and secured to printed circuit board 704 forming chip stack 708. Printed circuit board 704 may be any type of mounting surface or substrate. While there are many memory device stack configurations, such as the exemplary stacking configuration shown in FIG. 7, those configurations electrically connect the data buses from the memory devices in the stack together and pin out separate chip select signals for each memory device. The chip select signal is a signal that selects which memory device to access, for example, selecting a chip closest to the substrate (which may be referred to as the bottom chip) or selecting a memory device mounted on top of the bottom chip (which may be referred to as the top chip). Thus, a memory device stack using a four-bit wide memory device will fit in the same footprint as an unstacked four-bit wide memory device and be recognized by a memory controller as two independent memory devices coupled electrically to the same data bus. However, since the data buses from the stacked memory devices are electrically connected together, the stacked memory devices have to be accessed independently using a chip select signal instead of the memory devices having the capability of being accessed in parallel.

Figure 8:
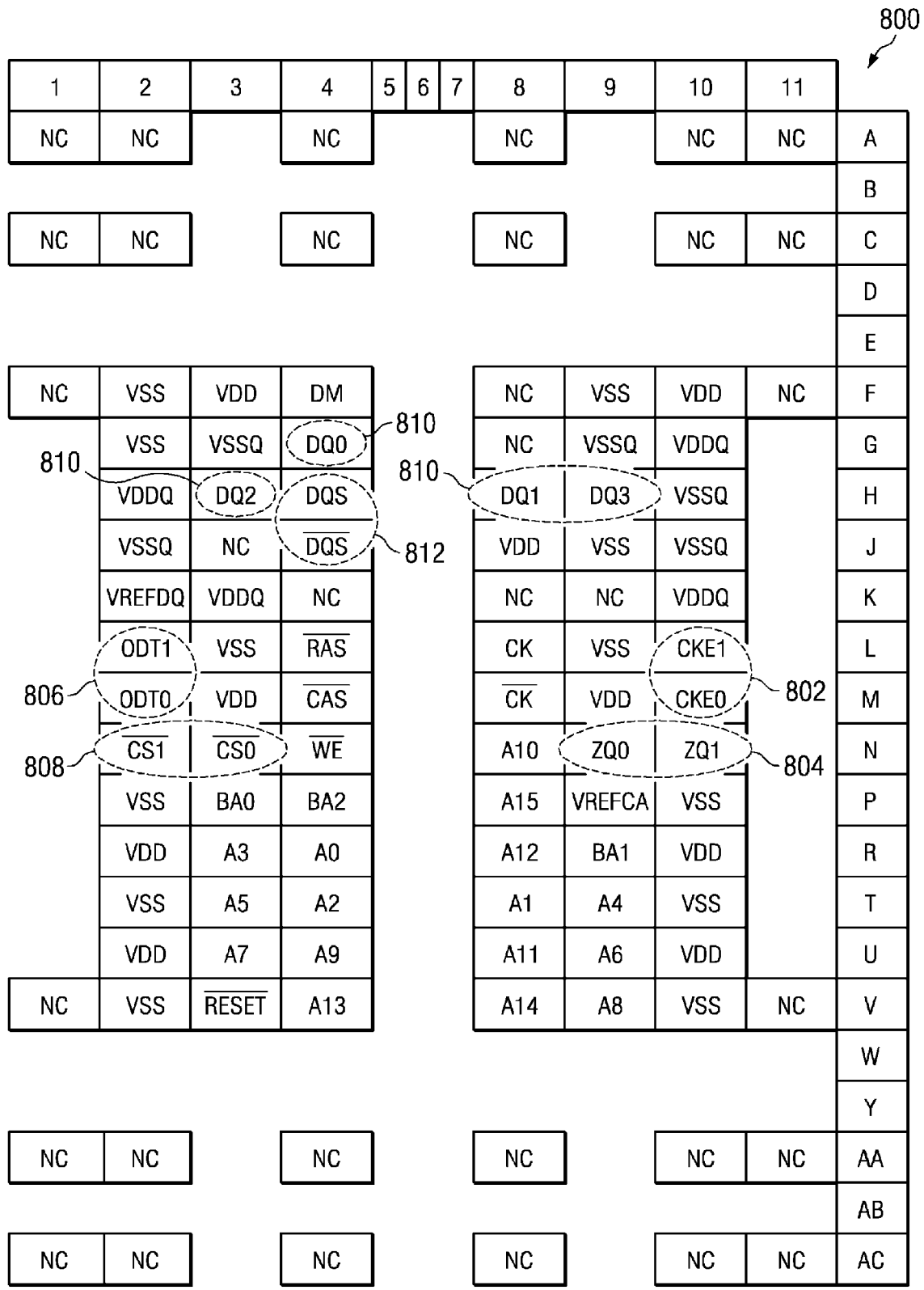
FIGS. 8 and 9 depict memory module stacking implementations within a memory system in accordance with the illustrative embodiments.
Figure 9:
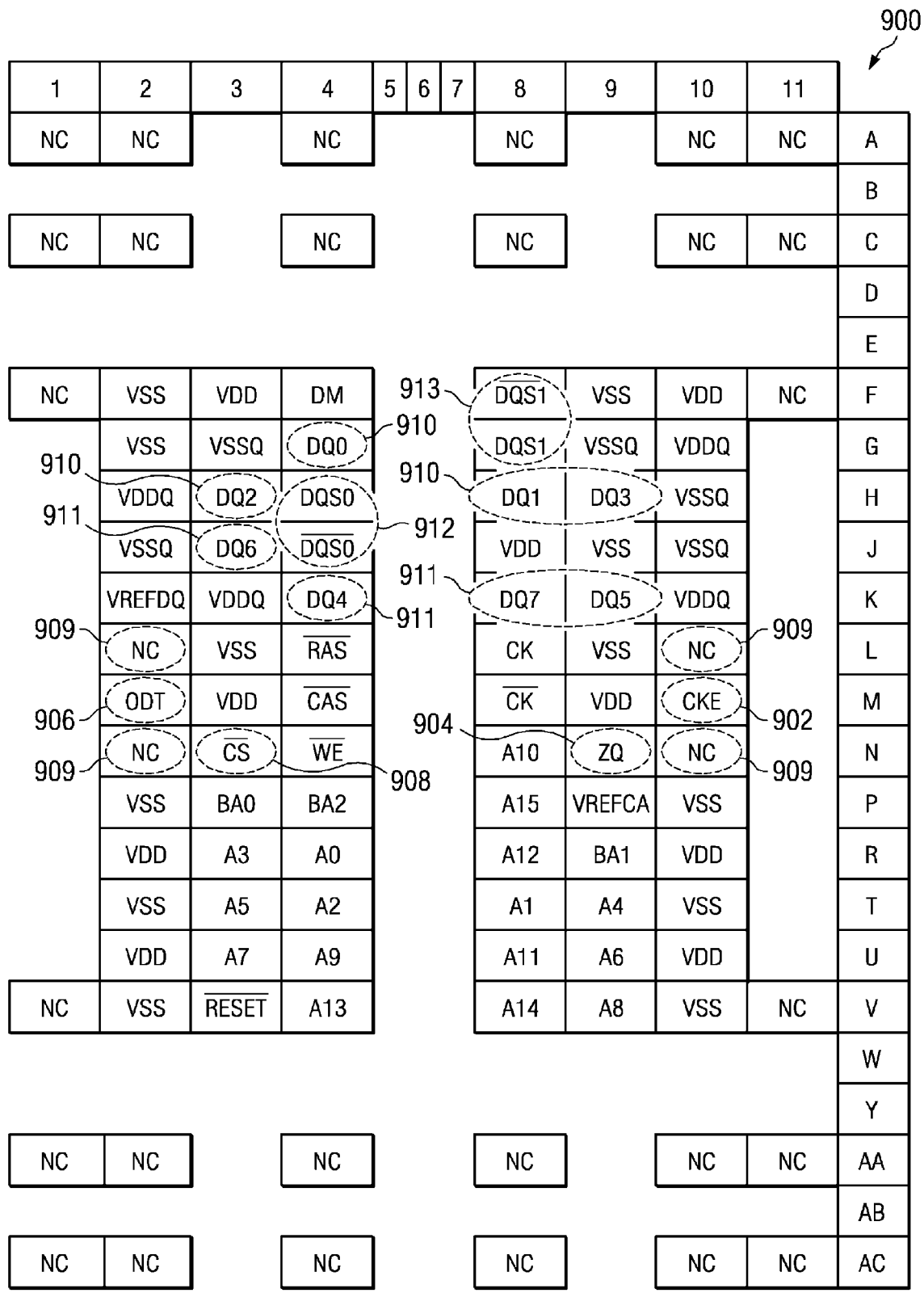

FIGS. 8 and 9 depict memory module stacking implementations within a memory system in accordance with an illustrative embodiment. FIG. 8 depicts an exemplary ball-out for two memory devices in a memory device stack that electrically connects the data buses from the two memory devices in the stack together and pins out separate chip selects for each memory device. A ball-out describes all of the electrical connections for coupling a memory device to the substrate of the memory module. FIG. 9 depicts a memory module stacking implementation that pins out the data buses of two stacked four-bit wide memory devices separately but electrically connects the chip select signals of the two four-bit wide memory devices together for parallel access. In these illustrative embodiments, FIGS. 8 and 9 depict an exemplary ball-out for a double-data-rate three (DDR3) four-bit two-high memory device stack. Although, there are numerous pins for the depicted ball-outs, for ease of explanation the illustrative embodiments discuss only the pins that will pin out the data buses of two stacked four-bit wide memory devices separately but electrically connects the chip select signals of the two four-bit wide memory devices together for parallel access.

With regard to FIG. 8, for a standard DDR3 four-bit two-high memory device stack, ball-out 800 includes two clock enable signals 802 (labeled CKE0 and CKE1) to turn the clock to the memory devices on and off, two calibration signals 804 (labeled ZQ0 and ZQ1) to calibrate the memory devices, two on-die termination signals 806 (labeled ODT0 and ODT1) to turn the electrical termination to the memory devices on and off, and two chip select signals 808 (labeled CS0 bar and CS1 bar) that provide reading from either the top or the bottom memory device of the stacked memory devices. Ball-out 800 also includes data bus lines 810 (labeled DQ0, DQ1, DQ2, and DQ3), collectively referred to as the data bus, to write and read data from the respective one of the stacked memory devices based on the enabled chip select signal 808, and strobe signals 812 (labeled DQS and DQS bar) which work as a pair to identify when data on data bus lines 810 is valid. Thus, with ball-out 800 the memory devices are required to be accessed independently since the data buses from the stacked memory devices are electrically connected together through data bus lines 810.

With regard to FIG. 9, for an improved DDR3 four-bit two-high memory device stack, ball-out 900 includes clock enable signal 902 (labeled CKE) to turn the clock to the memory devices on and off, calibration signal 904 (labeled ZQ) to calibrate the memory devices, on-die termination signal 906 (labeled ODT) to turn the electrical termination to the memory devices on and off, and chip select signal 908 (labeled CS bar) to provide reading the stacked memory devices. Since ball-out 900 electrically connects the chip select signals, as well as the clock enable signals, calibrations signals, and on-die terminations signal, of the two four-bit wide memory devices together for parallel access, the secondary clock enable signal, calibration signal, on-die termination signal, and chip select signal shown in FIG. 8 are changed to no connects (NC) 909. Ball-out 900 also includes data bus lines 910 (labeled DQ0, DQ1, DQ2, and DQ3), collectively referred to as data bus 0, to write and read data from a first memory device of the stacked memory devices. In this implementation, previous no connect (NC) pins are reassigned as data bus lines 911 (labeled DQ4, DQ5, DQ6, and DQ7), collectively referred to as data bus 1, to write and read data from the second memory device of the stacked memory devices.

Ball-out 900 also reassigns strobe signals DQS and DQS bar as strobe signals 912 (labeled DQS0 and DQS0 bar) for the first memory device of the stacked memory devices, which work as a pair to identify when data on the data bus 0 is valid. Additionally, ball-out 900 also reassigns previous NC pins as strobe signals 913 (labeled DQS1 and DQS1 bar) for the second memory device of the stacked memory devices, which work as a pair to identify when data on the data bus 1 is valid. Thus, with ball-out 900 the memory devices are accessed in parallel using data bus lines 910 and data bus lines 911, also referred to as data bus 0 and data bus 1 respectively, since the data buses of the stacked memory devices are separately pinned out.

Thus, pinning out the data buses of the two stacked four-bit wide memory devices separately while electrically connecting the chip selects signals together results in the two four-bit wide memory devices appearing to a memory controller as a single eight-bit wide memory device that provides two-times the density. Using this configuration provides four eight-byte data buses on a memory module in only 36 memory device data sites and looks like a memory module using eight-bit wide memory device chips but have the reliability of a memory module with 72 memory device data sites using four-bit wide data chips.

It should be appreciated that FIGS. 8-9 are only exemplary and are not intended to assert or imply any limitation with regard to the ways that data buses may be separately connected while access in parallel using commonly connected chip select signals. Many modifications to the depicted connections may be made without departing from the spirit and scope of the present invention.

Thus, the illustrative embodiments provide mechanisms for enhancing the memory bandwidth available through a buffered memory module. In one illustrative embodiment, a memory hub device of a memory module provides multiple memory device data interfaces that interface between a memory controller of a processor and memory devices on the memory module. A memory hub device with multiple memory device data interfaces provides a better match between the bandwidth on a memory channel coupled to the memory module and the bandwidth of the memory device data interface of a single memory module. In a second illustrative embodiment, a memory hub device with multiple memory device data interfaces provides for doubling the storage capacity of the memory module. In a third illustrative embodiment, a memory module is provided that provides for two high-frequency, high-bandwidth point-to-point interfaces to a memory controller. In a fourth illustrative embodiment, a memory stacking implementation is provided that pins out the data buses of the two stacked four-bit wide memory devices separately but electrically connects the chip select signals of the two four-bit wide memory devices together for parallel access of the stacked memory devices.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory system, comprising:
   a memory hub device integrated into a memory module;
   a first memory device data interface integrated in the memory hub device that communicates with a first set of memory devices integrated in the memory module; and
   a second memory device data interface integrated in the memory hub device that communicates with a second set of memory devices integrated in the memory module, wherein the first memory device data interface is separate from the second memory device data interface, wherein the first set of memory devices are spaced in a first plane and coupled to a substrate of the memory module, wherein the second set of memory devices are spaced in a second plane above the first plane and coupled to the substrate, wherein data buses of the first set of memory devices are coupled to the substrate separately from data buses of the second set of memory devices; and a memory hub controller coupled to the first memory device data interface and the second memory device data interface, wherein:

the memory hub controller responds to a plurality of access request packets from one of the memory controller or a downstream memory hub device of another memory module by responsively driving the first set of memory devices and the second set of memory devices using a memory device address and control bus and directing two of a read data flow selector, a first write data flow selector, or a second write data flow selector at the same time, responsive to receiving a read data access request and a write data access request, the memory hub controller drives the read data flow selector to a first multiplexer of the memory hub device to select outputting read data directly from one or more of the first memory device data interface, the second memory device data interface, or a read data queue, and drives either the first write data flow selector to a second multiplexer or the second write data flow selector to a third multiplexer for selecting either a direct input from a link interface of the memory hub device or an input from a write data queue of the memory hub device, responsive to receiving two write data access requests, the memory hub controller drives the first write data flow selector to the second multiplexer and the second write data flow selector to the third multiplexer for selecting either a direct input from a link interface of the memory hub device or an input from a write data queue of the memory hub device, and the second multiplexer provides an output to the first memory device data interface and the third multiplexer provides an output to the second memory device data interface.

2. The memory system of claim 1, wherein at least one of chip select signals, clock enable signals, calibration signals, or on-die termination signals of the first set of memory devices and the second set of memory devices are coupled together to the substrate.

3. The memory system of claim 1, wherein the second set of memory devices is stacked over the first set of memory devices.

4. The memory system of claim 1, wherein a first memory access request is processed via the first memory device data interface and a second memory access request is processed via the second memory device data interface at a same time in a parallel manner using a chip select signal.

5. The memory system of claim 1, wherein the memory system further comprises:

a memory channel for communicating with the first set of memory devices and second set of memory devices via the memory hub device; and a memory controller in communication with the memory channel, wherein the memory controller generates memory access requests, receives memory access requests, and responds to memory access requests.

6. The memory system of claim 1, wherein the memory hub controller, in response to receiving a plurality of write access request packets, issues a first memory write access request to the first set of memory devices via the first memory device data interface and sends first data associated with the first memory write access request by driving the first write data flow selector to the second multiplexer and immediately issues a second memory write access request to the second set of memory devices via the second memory device data interface and sends second data associated with the second memory write access request by driving the second write data flow selector to the third multiplexer.

7. The memory system of claim 1, wherein the memory hub controller, in response to receiving a plurality of read access request packets, issues a first memory read access request to the first set of memory devices via the first memory device data interface and immediately issues a second memory read access request to the second set of memory devices via the second memory device data interface.

8. The memory system of claim 7, wherein read data from the first memory read access request and the second memory read access request are directly transferred to the memory controller.

9. The memory system of claim 7, wherein read data from the first memory read access request and the second memory read access request are queued prior to being transferred to the memory controller.

10. The memory system of claim 1, wherein the memory system is part of a data processing device.

11. The memory system of claim 1, wherein the memory system is a main memory of a data processing device.

12. The memory system of claim 1, wherein the memory module is a dual in-line memory module (DIMM).

13. The memory system of claim 1, wherein the memory module is a single in-line memory module (SIMM).

14. A method of accessing memory devices of a memory module, comprising:

receiving, by a link interface of a memory hub device integrated in the memory module, a plurality of access requests for accessing a portion of one of a first set of memory devices that are coupled to internal logic of the memory hub device or a second set of memory devices integrated in the memory module that are coupled to internal logic of the memory hub device;

sending, by the link interface, the plurality of access requests to a memory hub controller integrated into the memory hub device;

selecting, by the memory hub controller, one or both of a first memory device data interface integrated in the memory hub device or a second memory device data interface integrated in the memory hub device, for performance of the plurality of access requests;

responsively driving, by the memory hub controller, the first set of memory devices and the second set of memory devices using a memory device address and control bus and directing two of a read data flow selector, a first write data flow selector, or a second write data flow selector at the same time in response to receiving a plurality of access request packets from one of the memory controller or a downstream memory hub device of another memory module, wherein:

responsive to receiving a read data access request and a write data access request, the memory hub controller drives the read data flow selector to a first multiplexer of the memory hub device to select outputting read data directly from one or more of the first memory device data interface, the second memory device data interface, or a read data queue, and drives either the first write data flow selector to a second multiplexer or the second write data flow selector to a third multiplexer for selecting either a direct input from a link interface of the memory hub device or an input from a write data queue of the memory hub device, responsive to receiving two write data access requests, the memory hub controller drives the first write data flow selector to the second multiplexer and the second write data flow selector to the third multiplexer for selecting either a direct input from a link interface of the memory hub device or an input from a write data queue of the memory hub device, and the second multiplexer provides an output to the first memory device data interface and the third multiplexer provides an output to the second memory device data interface; and accessing one of the first set of memory devices or the second set of memory devices in the memory module based on the selected first memory device data interface or the second memory device data interface, wherein:

the first memory device data interface communicates with the first set of memory devices, the second memory device data interface communicates with the second set of memory devices, the first set of memory devices are separate from the second set of memory devices, the first memory device data interface is separate from the second memory device data interface, and the first memory device data interface and the second memory device data interface process access requests in parallel at a same time, thereby increasing a bandwidth for accessing the first and second set of memory devices relative to a memory module having a single memory device data interface, wherein the first set of memory devices are spaced in a first plane and coupled to a substrate of the memory module, wherein the second set of memory devices are spaced in a second plane above the first plane and coupled to the substrate, wherein data buses of the first set of memory devices are coupled to the substrate separately from data buses of the second set of memory devices.

15. A data processing system, comprising:

a processor; and a memory coupled to the processor, wherein the memory comprises at least one memory module, and wherein each memory module in the at least one memory module comprises:

a memory hub device integrated in the memory module, wherein the memory hub device comprises:

a first memory device data interface integrated in the memory hub device that communicates with a first set of memory devices integrated in the memory module;

a second memory device data interface integrated in the memory hub device that communicates with a second set of memory devices integrated in the memory module, wherein the first memory device data interface is separate from the second memory device data interface and wherein the second set of memory devices are spaced in a second plane above the first plane and coupled to the substrate, wherein data buses of the first set of memory devices are coupled to the substrate separately from data buses of the second set of memory devices;

a memory hub controller coupled to the first memory device data interface and the second memory device data interface, wherein:

the memory hub controller responds to a plurality of access request packets from one of the memory controller or a downstream memory hub device of another memory module by responsively driving the first set of memory devices and the second set of memory devices using a memory device address and control bus and directing two of a read data flow selector, a first write data flow selector, or a second write data flow selector at the same time, responsive to receiving a read data access request and a write data access request, the memory hub controller drives the read data flow selector to a first multiplexer of the memory hub device to select outputting read data directly from one or more of the first memory device data interface, the second memory device data interface, or a read data queue, and drives either the first write data flow selector to a second multiplexer or the second write data flow selector to a third multiplexer for selecting either a direct input from a link interface of the memory hub device or an input from a write data queue of the memory hub device, responsive to receiving two write data access requests, the memory hub controller drives the first write data flow selector to the second multiplexer and the second write data flow selector to the third multiplexer for selecting either a direct input from a link interface of the memory hub device or an input from a write data queue of the memory hub device, and the second multiplexer provides an output to the first memory device data interface and the third multiplexer provides an output to the second memory device data interface.

* * * * *